US012325908B2

(12) United States Patent
Fujino et al.

(10) Patent No.: US 12,325,908 B2
(45) Date of Patent: Jun. 10, 2025

(54) PLATINUM-BASED SPUTTERING TARGET, AND METHOD FOR PRODUCING THE SAME

(71) Applicants: TOHOKU UNIVERSITY, Sendai (JP); TANAKA KIKINZOKU KOGYO K.K., Tokyo (JP)

(72) Inventors: Akihito Fujino, Isehara (JP); Kunihiro Tanaka, Isehara (JP); Shuichi Kubota, Isehara (JP); Takao Asada, Isehara (JP); Tetsuo Endoh, Sendai (JP); Shoji Ikeda, Sendai (JP)

(73) Assignees: TOHOKU UNIVERSITY, Sendai (JP); TANAKA KIKIZOKU KOGYO K.K., Tokyo (JP)

( * ) Notice: Subject to any disclaimer, the term of this patent is extended or adjusted under 35 U.S.C. 154(b) by 0 days.

(21) Appl. No.: 18/036,827

(22) PCT Filed: Nov. 15, 2021

(86) PCT No.: PCT/JP2021/041818
§ 371 (c)(1),
(2) Date: May 12, 2023

(87) PCT Pub. No.: WO2022/102765
PCT Pub. Date: May 19, 2022

(65) Prior Publication Data
US 2023/0407459 A1    Dec. 21, 2023

(30) Foreign Application Priority Data
Nov. 16, 2020    (JP) ................................. 2020-189958

(51) Int. Cl.
*C23C 14/34*    (2006.01)
*C23C 14/14*    (2006.01)

(52) U.S. Cl.
CPC .......... *C23C 14/3414* (2013.01); *C23C 14/14* (2013.01)

(58) Field of Classification Search
CPC . C23C 14/3414; C23C 14/14; C23C 14/3407; C22C 5/04; C22F 1/00; C22F 1/14; B21B 1/02
(Continued)

(56) References Cited

U.S. PATENT DOCUMENTS

| 10,297,430 B2 * | 5/2019 | Maruko ................. B22D 7/005 |
| 2009/0028744 A1 | 1/2009 | Hui et al. |

(Continued)

FOREIGN PATENT DOCUMENTS

| JP | 2014-043614 A | 3/2014 |
| JP | 106282639 A * | 4/2017 |

(Continued)

OTHER PUBLICATIONS

Machine Translation of WO 2015111563 (Year: 2015).*
(Continued)

*Primary Examiner* — Rodney G McDonald
(74) *Attorney, Agent, or Firm* — Foley & Lardner LLP

(57) ABSTRACT

The present invention relates to a platinum-based sputtering target containing platinum or a platinum alloy. The platinum-based sputtering target of the present invention is characterized by a material structure in a thickness-direction cross section thereof. Specifically, when a thickness-direction cross section is equally divided into n sections (n=5 to 20) along a thickness direction, a region including (n−2) sections excluding both end sections is set as a determination region, and when an average grain size in each of the sections is measured in the determination region, as well as an average grain size in the entire determination region is measured, the average grain size in the entire determination (Continued)

region is 150 μm or less, and a coefficient of variation calculated based on the average grain size in each of the sections of the determination region is 15% or less.

9 Claims, 3 Drawing Sheets

(58) Field of Classification Search
USPC ........................................ 204/298.13, 298.12
See application file for complete search history.

(56) References Cited

U.S. PATENT DOCUMENTS

| | | | |
|---|---|---|---|
| 2016/0343553 | A1 | 11/2016 | Maruko et al. |
| 2019/0103257 | A1 | 4/2019 | Kato et al. |

FOREIGN PATENT DOCUMENTS

| | | |
|---|---|---|
| JP | 6514646 B2 | 5/2019 |
| KR | 2009-0010854 A | 1/2009 |
| TW | 201538752 A | 10/2015 |
| TW | 201712129 A | 4/2017 |
| WO | WO-2015/111563 A1 | 7/2015 |
| WO | WO-2016/208552 A1 | 12/2016 |
| WO | WO-2017/209281 A1 | 12/2017 |

OTHER PUBLICATIONS

Machine Translation of CN 106282639 A (Year: 2017).*
Taiwanese Patent Office, "Office Action and Search Report," issued in connection with Taiwanese Patent Application No. 110142147, dated Jul. 4, 2022.
International Searching Authority, "International Search Report," issued in connection with International Patent Application No. PCT/JP2021/041818, dated Dec. 14, 2021.
International Searching Authority, "Written Opinion," issued in connection with International Patent Application No. PCT/JP2021/041818, dated Dec. 14, 2021.
Office Action issued in corresponding Japanese Patent Application No. 2020-189958 dated Aug. 5, 2024 (6 pages).

* cited by examiner

200 μm

PLATINUM-BASED SPUTTERING TARGET, AND METHOD FOR PRODUCING THE SAME

CROSS-REFERENCE TO RELATED APPLICATIONS

The present application claims priority under 35 U.S.C. § 371 to International Patent Application No. PCT/JP2021/041818, filed Nov. 15, 2021, which claims priority to and the benefit of Japanese Patent Application No. 2020-189958, filed on Nov. 16, 2020. The contents of these applications are hereby incorporated by reference in their entireties.

BACKGROUND OF THE INVENTION

Field of the Invention

The present invention relates to a platinum-based sputtering target containing platinum or a platinum alloy. More particularly, it relates to a platinum-based sputtering target capable of forming thin films with high in-plane uniformity stably for a longer period of time than in conventional techniques with suppressing thickness change over time of thin films formed during the use.

Description of the Related Art

Platinum is a conductive material having good chemical stability, and is being examined to be applied as a thin film electrode of a semiconductor device such as a FeRAM, or a DRAM. Platinum is a non-magnetic material, but is known to exhibit perpendicular magnetic anisotropy when formed into an alloy with a ferromagnetic material, or when multilayered at a nanometer level. By utilizing this phenomenon, a thin film containing platinum or a platinum alloy is expected also as a constituent material of a magnetic recording surface of a magnetic recording medium. In forming a thin film electrode, a magnetic recording surface or the like, a sputtering method using a platinum-based sputtering target (hereinafter, sometimes simply referred to as a target) containing platinum or a platinum alloy is applied.

When a thin film electrode, a magnetic recording surface or the like is formed by a sputtering method, in-plane distribution of a film thickness is required to be uniform. Therefore, also a sputtering target needs to be uniform in a sputter rate within a sputter surface. As means for assuring uniformity in the sputter rate of a sputtering target, crystal grain refinement on the target surface is regarded suitable. A sputter rate differs depending on a crystal orientation, and hence a sputtering target having aligned crystal orientations is preferably applied ideally, but such a target is realistically/industrially difficult to produce. Therefore, a difference in the sputter rate depending on an orientation difference is reduced by refining crystal grains, and thus, a stable sputter rate can be obtained as a whole.

Also in a platinum-based sputtering target, it is known to refine crystal grains for ensuring in-plane uniformity in film thickness. For example, Patent Document 1 discloses a platinum sputtering target having an average grain size of 50 μm or less, and having a tolerance of the grain sizes in the in-plane direction and the thickness direction of the target surface of 20% or less. This platinum sputtering target is produced by subjecting an ingot resulting from melting and casting to primary forging and secondary forging in a prescribed temperature range, and then subjecting the resultant to cross rolling in a prescribed temperature range, and then to a heat treatment. In this production process, a strain is introduced by forging and cross rolling, and the heat treatment is subsequently performed for refinement of crystal grains through recrystallization.

PRIOR ART DOCUMENT

Patent Document

Patent Document 1
    Japanese Patent No. 6514646

SUMMARY OF THE INVENTION

Technical Problem

The above-described in-plane uniformity in film thickness of a sputtering target is required to be continuous. A sputtering target is usually used repeatedly, and provides thin films onto a large number of substrates. Even when in-plane uniformity is attained at an initial stage of use, if the in-plane uniformity is reduced in accordance with accumulation of usage time, it is impossible to stably produce products. The significance of the in-plane uniformity over time is increasing in these years, and requirements thereof have become strict.

For example, in a magnetic random access memory (MRAM), which has been developed as a next generation magnetic recording medium, its memory element, a magnetic tunnel junction device (MTJ device) is constituted by a large number of thin films including a platinum thin film. In order that this memory element having a multilayer structure exhibits an expected function, it is indispensable that individual thin films respectively have thicknesses as designed. In the production of a memory element, a thin film having a multilayer structure is formed on one substrate, and the resultant is divided into individual elements. If a target that cannot retain in-plane uniformity over time is used, the film thickness of memory elements to be produced is varied. The variation in film thickness leads to variation in electrical properties such as sheet resistance, namely, variation in sheet resistivity of the MTJ devices, resulting in producing out-of-standard elements. Such out-of-standard elements not only lower the product yield, but also affect reliability of the entire products. Therefore, in-plane uniformity stricter than in the conventional technique is required.

Under such a condition where strict requirements for in-plane uniformity over time are necessary, it is difficult for the above-described conventional platinum sputtering target to sufficiently meet the requirements. It has been confirmed, according to examination made by the present inventors, that the platinum-based sputtering target can form thin films with high in-plane uniformity at an initial stage of use, but variation is caused in film thickness during the use, and hence the requirements are not met.

The present invention was devised under this background, and an object is to provide, regarding a platinum-based sputtering target containing platinum or a platinum alloy, a platinum-based sputtering target capable of retaining in-plane uniformity over time, and capable of meeting the above-described strict requirements, and a method for producing the same.

Solution to Problem

The present inventors made earnest studies to solve the above-described problems, resulting in paying attention to an erosion profile of a sputtering target. A sputtering method is a thin film formation method in which a sputter particle of an ionized argon particle or the like is accelerated to collide with a target, and a constituent atom of the target sputtered through the momentum exchange thus caused is deposited on a substrate. There are several types of sputtering methods depending on the acceleration method for a sputter particle, and erosion of the target caused by progression of the sputtering is not uniform. For example, in magnetron sputtering that is currently the mainstream of the sputtering method, electrons are collected in the vicinity of a given orbit due to a surface magnetic field applied to the target, and a portion in the vicinity of the center of the target is liable to be quickly eroded. Owing to such uneven progression of the erosion, a target that is flat at the initial stage of use is changed to have an irregular uneven thickness through continuous thin film formation. When the thickness of the target has become uneven, constituent elements of the target are generated, by sputtering, respectively from positions different in thickness (depth from the initial surface).

Even though the sputtering target is in the uneven consumption form as described above, however, if the state of crystal grains is uniform in the thickness direction, the influence on in-plane uniformity is probably small. According to consideration/examination made by the present inventors, however, uniformity in the state of crystal grains in the thickness direction is not sufficient in a conventional sputtering target. In particular, it is considered that there is a factor causing variation in in-plane uniformity in the vicinity of the center in the thickness direction of the sputtering target.

Based on the above-described examination, the present inventors have considered that a factor of lowering in-plane uniformity over time in a conventional platinum-based sputtering target is uniformity of the state of crystal grains in the thickness direction in addition to the erosion profile of the target. In this respect, it is not that there have been no examination examples on the state of crystal grains in the thickness direction of a sputtering target. For example, also in Patent Document 1 described above, a tolerance of a grain size in the thickness direction of the sputtering target is prescribed. Also in such a sputtering target, however, in-plane uniformity is reduced over time in some cases, which means that this problem cannot be coped with by the prescription of the conventional technique.

Therefore, the present inventors have examined a production method different from the conventional one for finding a sputtering target having stable sputtering properties during long-term use. As a result, a sputtering target in a strict state of a grain size in the thickness direction has been found, and thus, the present invention has been conceived.

Specifically, the present invention is drawn to a platinum-based sputtering target containing platinum or a platinum alloy, in which assuming that a thickness-direction cross section is equally divided into n sections (n=5 to 20) along a thickness direction, that a region including (n−2) sections excluding both end sections is set as a determination region, and that an average grain size in each of the sections is measured in the determination region and an average grain size in the entire determination region is measured, the average grain size in the entire determination region is 150 or less, and a coefficient of variation calculated based on the average grain size in each of the sections of the determination region is 15% or less.

As described above, in the platinum-based sputtering target of the present invention, a material structure in the thickness-direction cross section is prescribed. Specifically, a prescribed region in the thickness-direction cross section is set as the determination region for determining in-plane uniformity, and an average grain size in the entire region is prescribed. In addition, the cross section is divided into a plurality of sections, an average grain size of each section is measured, and a coefficient of variation obtained based thereon is strictly restricted. Now, respective constituents of the present invention will be described.

It is noted that the platinum-based sputtering target of the present invention contains platinum (pure platinum) or a platinum alloy. As the platinum alloy, a platinum alloy containing, as an additional element, any one of Pd (palladium), Rh (rhodium), Ir (iridium), Ru (ruthenium), Co (cobalt), Mn (manganese), Ni (nickel), and W (tungsten) is applied. As the platinum alloy, an alloy containing the additional element in an amount of 0.1 at % or more and 30 at % or less is applied.

In the present invention, the thickness direction refers to a direction substantially orthogonal to a sputter surface. A sputter surface refers to a surface with which inert gas ions mainly collide to release atoms constituting the target. A cross section refers to an arbitrary surface cut in the thickness direction. A target resulting from rolling step has, as the cross section, a rolled cross section (RD) that is parallel to a rolling direction, and a rolling vertical cross section (TD) that is vertical to the rolling direction. In the present invention, however, to be parallel to the rolling direction and to be vertical to the rolling direction are defined to have a tolerance of ±20°.

Further, the rolling direction refers to a rolling direction employed in final rolling step. As described below, a platinum target of the present invention may employ cross rolling in rolling step performed after forging in some cases. The cross rolling is a method in which rolling in a width direction (vertical direction) is performed in addition to rolling step in a length direction (longitudinal direction) of a material. Therefore, for example, when the rolling direction employed in final rolling is the length direction, a cross section parallel to the length direction is the rolled cross section (RD), and a cross section vertical to the length direction is the rolling vertical cross section (TD). In the present invention, it is necessary to meet both the requirements of the average grain size of the entire region and the coefficient of variation in each determination region in both the rolled cross section and the rolling vertical cross section.

(A) Structure of Platinum-Based Sputtering Target of the Invention (i) Determination Region In the present invention, the cross section of a target is equally divided into n sections (n=5 to 20) along the thickness direction, a region including (n−2) sections excluding both end sections is set as a determination region, and an average grain size and a coefficient of variation in this region are prescribed. Then, based on these values, in-plane uniformity over time of the target is determined. The number of the sections is 5 or more and 20 or less because if the number of sections is less than 5, each section is so wide that statistical reliability is poor. In this case, even if the coefficient of variation of the average grain size in each section of the determination region meets the requirements of the present invention, it cannot be regarded that variation in the grain size is suppressed. Therefore, there is a possibility that the resultant cannot be a target capable of retaining in-plane uniformity over time. Alternatively, also when the cross section is divided into a number exceeding the area of each section is so small that the number of crystal grains included in each section is small, and hence statistical reliability is low. Therefore, the number n of the sections is 5 or more and 20 or less.

As an index of setting the number n of sections for assuring statistical reliability, it is preferable that each section include about 150 to 200 crystal grains. Specifically, an average grain size in the entire cross section of a target of the present invention is 150 µm or less (preferably 40 µm or less) as described below, and hence, the number of sections is set preferably based on the average grain size and the thickness of the target.

The both end sections are excluded from the determination region of the present invention because the end section on a surface side (sputter surface side) of the target is a region used at the initial stage of sputtering step, and hence is an unnecessary portion in considering the in-plane uniformity over time. On the other hand, the end section on a rear surface side is excluded from the determination region because this region is not used. In addition, a sputtering target is usually used with a backing plate joined to the rear surface, and hence there is no need to consider the section in the vicinity of the rear surface.

(ii) Average Grain Size in Entire Determination Region

In the platinum-based sputtering target of the present invention, the average grain size in the determination region is defined as an average grain size in the entire target, and this value is set to 150 µm or less. The present inventors recognize usefulness of crystal grain refinement in a sputtering target for exhibiting stable sputtering properties. The sputtering target of the present invention contains fine crystal grains having an average grain size of 150 µm or less. The average grain size is preferably 40 µm or less.

Determination of crystal grains (determination of a grain boundary) in the cross section of the target, and measurement/calculation of a grain size and an average grain size are not especially limited. For example, the target may be cut along an arbitrary cross section to be appropriately etched for structure observation, and grain sizes of all crystal grains within an observation region may be measured to obtain an average. Alternatively, a plurality of crystal grains may be arbitrarily extracted from the observation region, and the grain sizes thereof may be measured to obtain an average. In such measurement of grain sizes, an average of a long diameter and a short diameter may be employed for a grain size calculation method. Furthermore, as an average grain size measurement method, a line method is also known. In the line method, a plurality of lines are arbitrarily drawn in a structure observation result (photograph). Then, based on the number of crossing points (intersections) between a line and grain boundaries, and the length of the line, an average grain size on the line is calculated, this operation is performed on each of the lines to obtain an average of all the lines as a grain size. The line method is a method by which an average grain size can be comparatively easily obtained.

Alternatively, an average grain size can be measured using appropriate analysis means and image processing after cutting a cross section of the target. An example of the appropriate analysis means includes electron backscatter diffraction (EBSD). EBSD is an analysis method capable of rapidly obtaining information on orientation analysis of crystal grains. When processing with appropriate image analysis software is performed, identification of grain boundaries, measurement of grain sizes, and calculation of an average grain size can be performed.

As described above, the measurement of an average grain size of the target is not especially limited, and there are some conventionally known methods. In the measurement of an average grain size in the entire cross section and an average grain size in each determination region, however, it is preferable to perform the measurement by using the same measurement method.

In the present invention, an average grain size in the surface direction of the surface (sputter surface) of the platinum-based sputtering target is not especially prescribed. As described below, however, a treatment for causing crystal grain refinement through recrystallization all over a material is performed in production process of the target in the present invention. Therefore, a material structure having refined crystal grains is found also on the surface of the target. Therefore, it is preferable that the average grain size on the surface of the target be also 150 µm or less, and preferably 40 µm or less.

In the present invention, the target is equally divided into n sections in the thickness direction, and since the both end sections are excluded from the determination region, the average grain size of crystal grains included in these sections is not taken into consideration. It goes without saying that the average grain size in the entire thickness of the target including the end sections may be 150 µm or less, and preferably 40 µm or less.

(iii) Coefficient of Variation of Average Grain Size in Determination Region

In the present invention, based on the average grain size in each section of the determination region, the coefficient of variation (CV) of the average grain sizes in the respective sections included in the determination region is obtained. The coefficient of variation is a coefficient obtained by measuring average grain sizes in the respective sections of the determination region, calculating a standard deviation of these sizes, and dividing the standard deviation by the average grain size in the entire determination region.

As specific procedures for measuring the average grain sizes in the respective sections and the coefficient of variation, the determination region including the (n−2) sections obtained by equally dividing the cross section of the platinum-based sputtering target into n sections, and excluding the end sections is set, and the average grain size in each section is observed/measured. Then, a standard deviation corresponding to a square root of variance (unbiased variance) of the average grain size in each section is calculated as follows. The coefficient of variation of the average grain sizes in the respective sections is calculated by dividing the standard deviation by the average grain size in the entire region.

$$s = \sqrt{\frac{1}{n-3}\sum_{i=2}^{n-1}(X_i - Xa)^2}$$ [Expression 1]

(n: number of sections, s: standard deviation of average grain size in each section, $X_a$: average grain size in entire determination region, $X_i$: average grain size in each section)

$$CV = s/X_a$$ [Expression 2]

(n: number of sections, CV: coefficient of variation of respective sections, s: standard deviation of average grain size in each section, $X_a$: average grain size in entire determination region)

In the platinum-based sputtering target of the present invention, the coefficient of variation calculated based on the average grain sizes of the (n−2) sections included in the determination region of the thickness-direction cross section requires to be 15% or less. If the coefficient of variation exceeds 15%, crystal grains ungood for assuring in-plane uniformity over time are included, and hence the problems of the present invention cannot be solved. The criterion of the coefficient of variation is preferably 10% or less, and more preferably 7% or less.

As described so far, the platinum-based sputtering target of the present invention is strictly prescribed in the average grain size of the crystal grains in the thickness-direction cross section, and thus, in-plane uniformity over time during use of the target is ensured. According to examination made by the present inventors, in order that a target exhibits stable sputtering properties over time, it is preferable to prescribe not only the refinement of grain sizes and the coefficient of variation of average grain sizes but also the shape of crystal grains.

Specifically, in the platinum-based sputtering target of the present invention, it is preferable that a number-based proportion of crystal grains having an aspect ratio of 3 or more is 20% or less, and that a number-based proportion of crystal grains having an aspect ratio of 5 or more be 9% or less in the determination region. An aspect ratio of the present invention is calculated, with respect to each crystal grain, as a ratio between a maximum diameter and a minimum diameter (maximum diameter/minimum diameter). Therefore, according to the criterion of the present invention, an aspect ratio is calculated as 1 or more, and as the value is larger, the crystal grain is flatter. In the present invention, for retaining in-plane uniformity over time during deposition, the shapes of the crystal grains in the cross sectional structure are also preferably uniform. In particular, proportions of flat crystal grains having aspect ratios of 3 or more, and 5 or more are preferably smaller. Therefore, the above-described requirement is preferred. With respect to the aspect ratios of crystal grains, the number-based proportion of crystal grains having an aspect ratio of 3 or more is more preferably 18% or less, and further preferably 7% or less. The number-based proportion of crystal grains having an aspect ratio of 5 or more is more preferably 3% or less, and further preferably 1% or less.

For measurement of aspect ratios of crystal grains, the cross sectional structure may be observed to measure respective sizes of the crystal grains in an observation photograph/image in the same manner as in the measurement of the average grain size. Image processing and software can also be used. It is noted that a number-based proportion of grains refers to a proportion based on the number of crystal grains to be measured for aspect ratios in a range of an observation region. As the crystal grains to be measured for aspect ratios, a plurality of grains may be arbitrarily extracted from crystal grains within the observation region, or all the crystal grains included in the observation region may be used as a measurement target.

(iv) Other Constitutions (Purity, and Relative Density)

The platinum-based sputtering target of the present invention preferably contains high purity platinum or platinum alloy for ensuring the quality as an electrode film/magnetic film. Specifically, a platinum sputtering target containing pure platinum has a platinum purity of preferably 99.99% by mass or more. Alternatively, a platinum-alloy sputtering target containing the above-described platinum alloy has a total purity of platinum and the additional element, that is, any one of Pd, Rh, Ir, Ru, Co, Mn, Ni, and W, of preferably 99.9% by mass or more. The upper limit of the purity of platinum or the platinum alloy is preferably 100% by mass, and in consideration of incidental impurities, is realistically 99.999% by mass or less.

Examples of incidental impurities of a platinum sputtering target containing pure platinum include elements such as Au, Ag, Pd, Rh, Ir, Ru, Os, Al, As, B, Bi, Ca, Cd, Co, Cr, Cu, Fe, Mg, Mn, Ni, Sb, Si, Sn, Ti, Zn, and W, and gas components such as O (oxygen), N (nitrogen), C (carbon), and S (sulfur). Also in a platinum-alloy sputtering target containing a platinum alloy, the above-described gas components and the elements of the above-described element group excluding the additional element of the platinum alloy can be incidental impurities. A content of these incidental impurities is preferably 100 ppm or less in total.

In addition, as described below, the platinum-based sputtering target of the present invention is a material produced by a melting and casting method. A platinum-based sputtering target produced by what is called a powder metallurgy method and containing a sintered body of a platinum powder or a platinum alloy powder is also known, but the present invention is distinguished from such a sintered target. Specifically, the platinum-based sputtering target of the present invention has a relative density, based on a theoretical density of platinum or a platinum alloy having the same composition, of 99.5% or more.

The platinum-based sputtering target of the present invention is not especially limited in the shape/size. The shape is generally a circular or rectangular plate shape, but is not limited thereto. The size is not also limited in flat size (diameter, long side or short side) and thickness.

(B) Method for Producing Platinum-Based Sputtering Target of the Invention

Next, a method for producing a platinum-based sputtering target of the present invention will be described. The platinum-based sputtering target of the present invention is produced basically through production process similar to that for a conventional target. The production process for a conventional platinum-based sputtering target is known to include producing a casting by melting and casting, forging it to produce an ingot, rolling the resultant to produce a rolled material having a size close to that of a product, and then subjecting the rolled material to a heat treatment. The heat treatment step performed last is a step of causing recrystallization, and is a step in which crystal grains are refined by using, as a driving force, lattice defects such as dislocation having been introduced through processing history so far to adjust the material structure.

The production process for the platinum-based sputtering target of the present invention also includes the melting and casting step, the forging step, the rolling step, and the recrystallization heat treatment step described above. In the present invention, however, a distribution of average grain sizes needs to be more strictly adjusted in the material structure in a thickness-direction cross section than in a conventional technique, and it is preferable to obtain good shapes (aspect ratios) of crystal grains.

According to the examination made by the present inventors, it is difficult to form a material structure prescribed in the present invention by a conventional production method. In particular, it is difficult to provide a coefficient of variation of average grain sizes in a region in the vicinity of a thickness center portion, and to obtain good aspect ratios of crystal grains. This is probably because a cast structure cannot be completely broken up to the center of a casting by the forging step following the melting and casting in the conventional process. In an ingot having a cast structure even slightly remaining in the center, dislocation is insufficiently introduced by rolling. Even if a recrystallization heat treatment is performed in such a state, it is difficult to obtain a material structure homogeneous in the thickness direction.

Therefore, for ensuring even progression of recrystallization in the heat treatment, particularly for ensuring evenness in the thickness direction, the present inventors have decided to perform forging so as not to allow a cast structure to remain in the center portion of the ingot, and to heat the ingot before rolling to perform the heat treatment after making the material structure of the ingot homogenous as a whole.

A method of the present invention including this homogenization heat treatment is a method for producing a platinum-based sputtering target including a forging step of forging at least once a cast platinum or platinum alloy resulting from melting and casting to produce an ingot, a rolling step of rolling at least once the ingot to produce a rolled material, and a recrystallization heat treatment step of heat treating the rolled material, in which a homogenization heat treatment for heating the ingot at a temperature of 850° C. or more and 950° C. or less is performed after the forging step and before the rolling step, and in which a heating temperature for the rolled material in the recrystallization heat treatment step is 600° C. or more and 700° C. or less. Now, the respective steps of this production method will be described.

(i) Melting and Casting Step

A melting and casting step is a step of obtaining cast of platinum or platinum alloy by melting a platinum metal of a raw material and an additional element metal, casting the resultant in a mold, and cooling the resultant. This step is not particularly different from that of a conventional technique. As the raw material metal, one having a high purity according with a purity of a product to be produced is used. The raw material metal is melted by heating with a high frequency melting furnace, an electric melting furnace, or a plasma melting furnace preferably in an inert gas atmosphere or a vacuum atmosphere. As the mold, a rectangular or circular mold is used in consideration of the shape of the product. The cooling after casting the melted metal may be performed at a slow cooling rate of furnace cooling or air cooling. It is noted that the ingot of platinum or a platinum alloy resulting from the melting and casting may be cut or milled for purposes of adjusting the size or removing a heterogeneous portion that may remain in an end portion. The shape of the casting produced here is not limited, and may be any one of a rectangular parallelepiped shape, a cubic shape, and a cylindrical shape.

(ii) Forging Step

The forging is a step of machining, by pressing/blowing, the cast platinum or platinum alloy into an ingot in shape and size easily subjected to processing in the rolling step described below. In addition, the forging step is performed also for a significant purpose of breaking the cast structure of the casting. In the forging step, a processing method employed in the conventional technique is basically applied. As a processing temperature employed in the forging, a temperature enabling deformation of the casting for molding/forging may be applied. In the present invention, since the homogenization heat treatment step described below is performed, there is no need to set temperature conditions for changing the material structure in the forging step. The processing temperature employed in the forging step can be set to 800° C. to 1300° C. The forging is performed at least once in this step, and may be performed intermittently a plurality of times if necessary.

In the present invention, it is considered significant, as the purpose of the forging step, to break the cast structure of the casting. In particular, it is considered significant to break the cast structure in a center portion of the casting. For this purpose, it is preferable to mold the casting with sufficient forging in the forging step of the present invention. As a specific index, the casting is forged preferably until the size in a direction corresponding to the maximum size becomes 50% or less. For example, when a casting in a rectangular parallelepiped shape is forged, the forging is performed preferably until the maximum side of the casting becomes 50% or less. This index of the processing size is applied at the end of the forging step (at the beginning of the subsequent homogenization heat treatment). When the forging step is completed with the forging performed once, the determination is made based on a size obtained at the end of the forging. When the forging is performed a plurality of times, the determination is made based on a size obtained at the end of the final forging. It is noted that a lower limit value of the maximum side of the casting obtained through the forging is preferably 30% or more. The forging should be performed as much as possible to break the cast structure. It is not, however, preferable that the temperature of the casting become too low in the forging, and hence, the lower limit of the maximum side of the casting may be 40% or more. When the forging is performed until the maximum side of the casting becomes 40% or more and 50% or less, the breakage of the cast structure, that is, the purpose of the forging, can be attained. The ingot of platinum or a platinum alloy obtained through the forging step described so far may be milled or faced if necessary.

(iii) Homogenization Heat Treatment Step

As described above, as a characteristic of the present invention, the ingot resulting from the forging step is subjected to a heat treatment before the subsequent rolling step. In the production process of a conventional platinum-based sputtering target, a heat treatment at a high temperature described below is not performed before rolling. This is because platinum is comparative softer and better in processability than the other precious metals and the like, and hence there is no need to employ a very high temperature in rolling. In temperature control in the conventional production process, however, the cast structure remains in the ingot, and hence sufficient recrystallization is not caused in the thickness direction even if rolling and recrystallization heat treatment are performed under this state, and the distribution of average grain sizes cannot be strictly adjusted.

In the production method of the present invention, the ingot is heat treated at a high temperature before the rolling step to once obtain a homogenous material free from a cast structure and a strain, so that the effect of the recrystallization heat treatment can be obtained in the entire target. Thus, recrystallization based on lattice defects such as dislocation introduced through the subsequent rolling step is homogeneously caused, so as to obtain a good distribution of average grain sizes in the thickness direction.

In the homogenization heat treatment, the ingot is heated at a temperature of 850° C. or more and 900° C. or less. When the temperature is lower than 850° C., a homogenized material is difficult to obtain. When the temperature exceeds 950° C., although strain in the material is sufficiently released, crystal grains are coarsened, which probably affects final product properties. A heating time of the homogenization heat treatment is preferably 60 minutes or more and 120 minutes or less. The treatment time is controlled in accordance with the treatment temperature and the thickness and the like of the ingot, and for obtaining complete homogenization, the heating needs to be performed at least for 60 minutes or more. On the other hand, even if the heat treatment is performed for an excessively long period of time, the effect of the homogenization does not differ, and hence, the processing time is 120 minutes or less in consideration of production efficiency.

(iv) Rolling Step

The rolling step is a processing step of processing the ingot of platinum or a platinum alloy resulting from the forging into a platinum plate material in size and shape necessary for obtaining a final size of a product. In addition, this is a step of introducing, into the homogenized ingot, lattice defects such as dislocation working as a driving force for recrystallization for crystal grain refinement. Therefore, the rolling step is also a significant step, but the rolling step itself can be performed with applying the same conditions as those for processing performed for a conventional platinum-based sputtering target. The rolling step is usually performed by cold rolling, and the processing is performed with a temperature of a material to be rolled set to to 200° C. The rolling step is performed at least once, and can be performed repeatedly if necessary. As for a rolling direction, unidirectional rolling may be employed, but cross rolling is preferably applied. In the rolling step, various types of rolling, such as broadside rolling, intermediate rolling, finish rolling, and flattening rolling, is performed in accordance with purposes. In the rolling step, a rolling direction/processing rate suitable for each rolling is set. The processing rate of the rolling step of the ingot resulting from the forging step is preferably 90% or more and 95% or less. For example, a thickness obtained after the final rolling is preferably 10% or less and 5% or more of the thickness of the ingot resulting from the forging step. The processing rate of 90% or more is thus set for accelerating the crystal grain refinement through the subsequent recrystallization by introducing a large number of processing strains.

(v) Recrystallization Heat Treatment Step

When the rolled material into which lattice defects have been introduced through the rolling step described above is heat treated, the crystal grains are refined through recrystallization. In particular, in the present invention, the rolling step is performed after performing the homogenization heat treatment described above, and hence lattice defects have been uniformly introduced in the entire material. Therefore, homogeneous crystal refinement is caused in the thickness direction through the recrystallization heat treatment, and hence crystal grains little varied in average grain size are generated. Good aspect ratios of the crystal grains in the thickness direction can also be obtained.

As heat treatment conditions in the recrystallization heat treatment step, a heating temperature is set to 600° C. or more and 700° C. or less. When the temperature is lower than 600° C., sufficient recrystallization is difficult to be caused. On the other hand, when the heat treatment is performed at a temperature exceeding 700° C., crystal grains become coarse, and it is concerned that the average grain size in the entire material may be out of the range of the present invention. It is also concerned that the coefficient of variation of average grain sizes in the determination region may increase.

A heating time of the recrystallization heat treatment is preferably 60 minutes or more and 120 minutes or less. In the present invention, it is necessary to cause sufficient recrystallization in the thickness direction of the target. In particular, sufficient heating is necessary for adjusting the average grain size and for optimizing the aspect ratios by causing recrystallization up to around the center portion in the thickness direction. Therefore, the lower limit of the processing time is 60 minutes. On the other hand, even if the heat treatment is performed over 120 minutes, the effect is little, and it is concerned that partial coarseness may be caused.

(vi) Optional Processing Step

Through the recrystallization heat treatment step described above, a platinum-based sputtering target having a material structure prescribed in the present invention can be produced. As a post-processing step, however, flattening, facing, cutting or the like may be performed.

Advantageous Effects of Invention

As described so far, the platinum-based sputtering target of the present invention has in-plane uniformity over time because average grain sizes in the thickness-direction cross section are prescribed more strictly than in a conventional technique. According to the present invention, in-plane uniformity at an initial stage of use can be retained, and hence platinum thin films or platinum alloy thin films having a constant film thickness can be stably formed over a long period of time.

DETAILED DESCRIPTION OF THE PREFERRED EMBODIMENTS

Now, a preferred embodiment of the present invention will be described. In the present embodiment, a platinum sputtering target containing pure platinum was produced as a platinum-based sputtering target. Referring to the above-described production process, platinum sputtering targets were produced under various conditions, so as to observe a material structure in a thickness-direction cross section, and measure an average grain size and a coefficient of variation of crystal grains. Further, platinum thin films were produced with a sputtering apparatus to evaluate in-plane uniformity in the thin films.

Example 1

[Melting and Casting Step/Forging Step]

Platinum with a purity of 99.99% was melted with a high frequency plasma melting furnace, the resultant was casted in a copper mold to produce a cast platinum (size: 30 mm (thickness)×75 mm (width)×205 mm (length)), and end portions thereof were cut to obtain a cast platinum with a size of 30 mm (thickness)×75 mm (width)×173 mm (length). The cast platinum was heated at 1300° C. for 30 minutes, and the resultant was forged continuously a plurality of times into a size of 60 mm (thickness)×78 mm (width)×82 mm (length). Through this forging step, the cast platinum was processed until the longest side (173 mm) was reduced to 47% (82 mm). Thereafter, the surface was faced, and the resultant was molded into a size of 55 mm (thickness)×78 mm (width)×82 mm (length) to produce a platinum ingot.

[Homogenization Heat Treatment Step]

Figure 1:
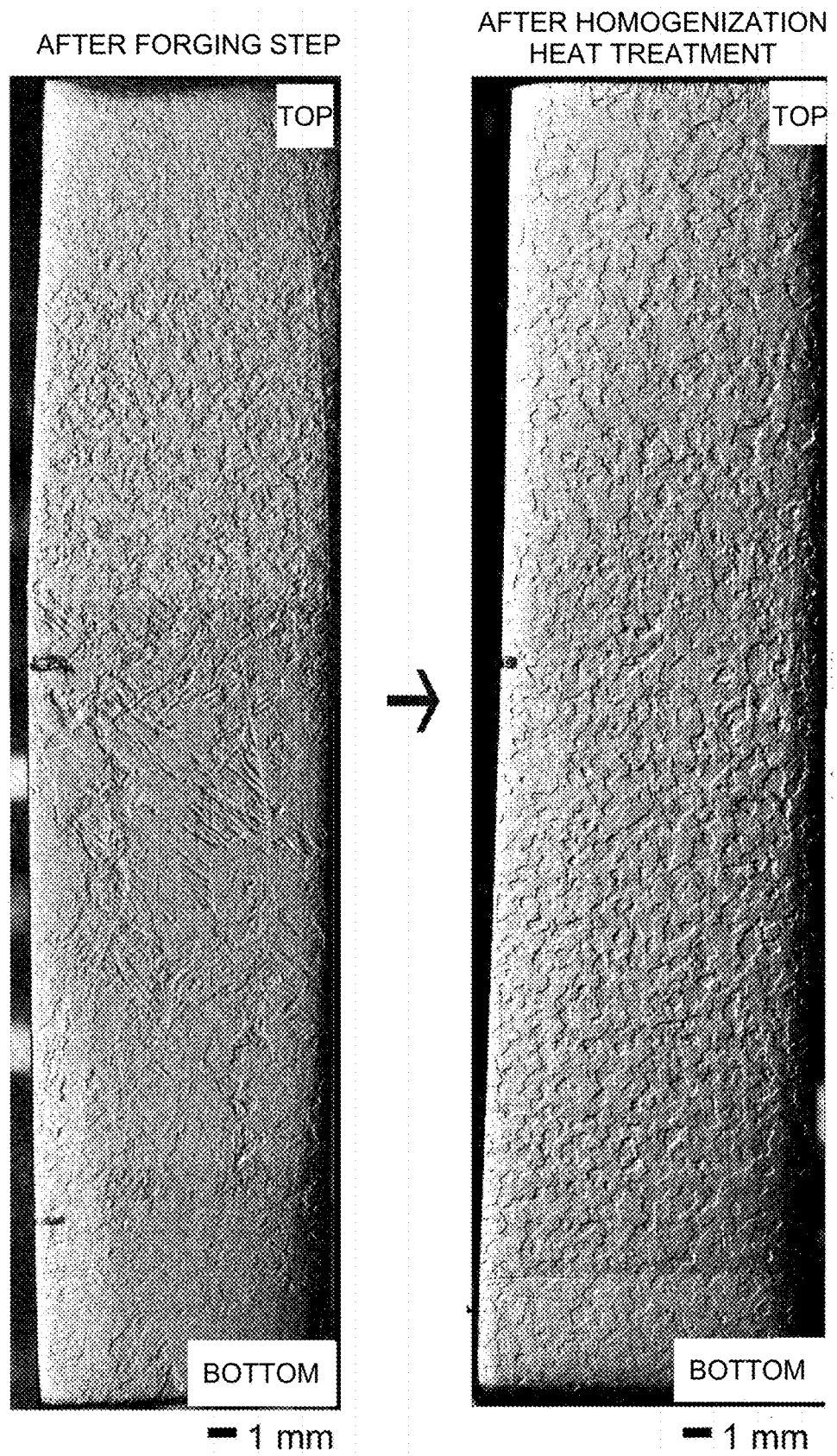
FIG. 1 illustrates photographs of a crystal structure of a platinum ingot obtained before a homogenization heat treatment (after a forging step) and after the homogenization heat treatment in production process of an embodiment of the invention.

Then, the platinum ingot resulting from the forging step was subjected to a homogenization heat treatment. In the homogenization heat treatment step, the platinum ingot was heated with an electric melting furnace at 900° C. for 60 minutes in the air. After the heating, the resultant was furnace cooled to obtain a platinum ingot to be supplied to the rolling step. Here, in order to describe change in material structure through the homogenization heat treatment, photographs of the material structure of the platinum ingot obtained before and after the homogenization heat treatment are shown in FIG. 1. This material structure observation was performed by observing, with a metallurgical microscope, a side surface of each target after being etched. As is understood from FIG. 1, the material structure of the platinum ingot after the homogenization heat treatment is largely changed from the material structure after the forging step. It is thus confirmed that the crystal structure of a platinum ingot is homogenized through the homogenization heat treatment.

[Rolling Step]

In the rolling step, the platinum ingot was rolled in the width and length directions into a size from which a target as a product could be cut out. First, broadside rolling was performed into a size of 16.4 mm (thickness)×270 mm (width)×85 mm (length). Thereafter, intermediate rolling was performed into a size of 6.77 mm (thickness)×273 mm (width)×197 mm (length), and then finish rolling was performed into a size of 3.1 mm (thickness)×273 mm (width)× 427 mm (length). Each rolling was performed after setting the material to be processed to 20° C. In this rolling step, a rolled material having a thickness of 3.1 mm was produced from the platinum ingot having a thickness of 55 mm, and hence, the processing rate of the rolling step is about 94%. The platinum plate material resulting from the rolling step was flattened with a roller, and cut to be used as a rolled material for the recrystallization heat treatment step.

[Recrystallization Heat Treatment Step]

In the recrystallization heat treatment step, the platinum rolled material having been cut after the rolling step was heated at 650° C. for 60 minutes. Thereafter, the resultant was flattened again with a roller. Then, a platinum sputtering target was produced.

Example 2

In this Example, a larger mold was used in the melting and casting step to produce a cast platinum larger than that of Example 1, and this casting was forged into the same size as that of Example 1 to produce a platinum ingot. In other words, the forging was further more sufficiently performed in Example 2 than in Example 1 to produce a platinum sputtering target. In the forging step of this Example, the forging was performed until the longest side of the cast platinum became 30%. The homogenization heat treatment, rolling treatment and recrystallization heat treatment following the forging step were the same as those of Example 1.

Example 3

In this Example, the forging was performed intermittently in two stages in the forging step. A cast platinum the same as that of Example 1 was produced, the cast platinum was heated at 1300° C. for 30 minutes, the resultant was forged into a size of 37 mm (thickness)×78 mm (width)×82 mm (length), and then the forging was intermitted once. Thereafter, the casting was heated again at 1300° C. for 30 minutes, and the resultant was forged into a size of 60 mm (thickness)×78 mm (width)×82 mm (length). The homogenization heat treatment, rolling treatment, and recrystallization heat treatment thereafter were the same as those of Example 1.

Comparative Example 1: As a Comparative Example of the above-described Examples, a target was produced through performing the rolling step and the recrystallization heat treatment without performing the homogenization heat treatment following the forging step. This Example was the same as Example 1 except that the homogenization heat treatment was not performed.

Comparative Example 2: A heating temperature in the recrystallization heat treatment step was higher than that in Example 1. A platinum ingot was produced in the same manner as in Example 1, the homogenization heat treatment was performed, and the rolling was performed, and thereafter, the resultant was heated at 900° C. for 60 minutes to perform the recrystallization heat treatment, and thus, a platinum sputtering target was produced.

Comparative Example 3: In this Comparative Example, a sample of a platinum sputtering target was produced without performing the recrystallization heat treatment step. A platinum sputtering target was produced without heat treating a platinum plate material resulting from the melting and casting step, the forging step, the homogenization heat treatment step, and the rolling step performed in the same manner as in Example 1.

The production conditions for the platinum sputtering targets of Examples 1 to 3 and Comparative Examples 1 to 3 described above are all listed in Table 1.

TABLE 1

|  | Forging Step | Homogenization Heat Treatment | Rolling Step | Recrystallization Heat Treatment |
|---|---|---|---|---|
| Example 1 | 47% (continuous) | 900° C. × 60 min | 94% | 650° C. × 60 min |
| Example 2 | 30% (continuous) |  |  |  |
| Example 3 | 47% (intermittent) |  |  |  |
| Comparative Example 1 | 47% (continuous) | Not performed | 94% | 650° C. × 60 min |
| Comparative Example 2 |  | 900° C. × 60 min |  | 900° C. × 60 min |
| Comparative Example 3 |  |  |  | Not performed |

Figure 2:
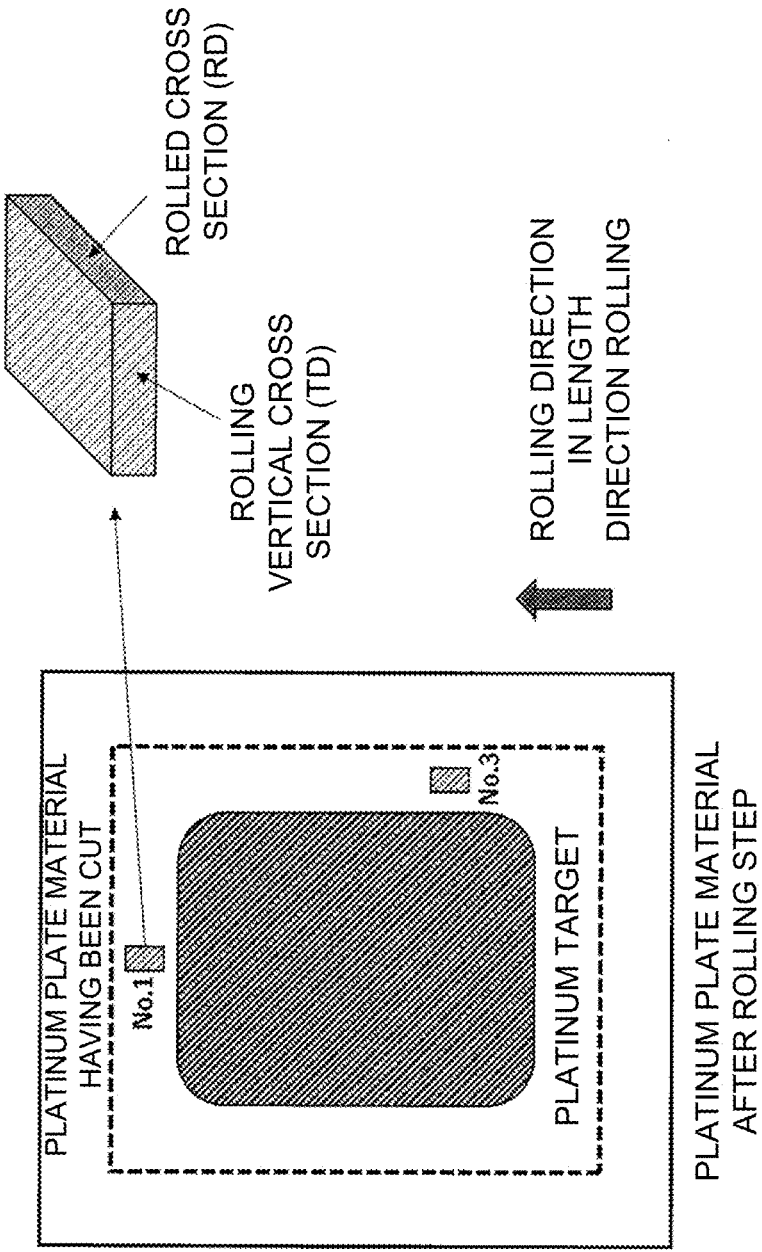
FIG. 2 is a diagram illustrating positions of collecting samples used in each Example/Comparative Example.

In the present embodiment, in the platinum sputtering target of each of the Examples/Comparative Examples, the average grain size in the thickness-direction cross section was first measured with observing the material structure in the thickness-direction cross section. In this review, in cutting out the platinum sputtering target after the recrystallization heat treatment of the platinum plate material having been cut, two samples were cut out, for the evaluation, from the vicinity of the target as illustrated in FIG. 2. As these samples, two samples (No. 1 and No. 3) were cut out respectively from a portion in the vicinity of the center in the length direction and a portion in the vicinity of the side surface of the target. The rolled cross section (RD) and the rolling vertical cross section (TD) were set in each of the samples, and each sample was cut and embedded in a resin so that the respective cross sections can be measured (sample size: 5 mm×10 mm). The thus resin embedded sample was subjected to manual polishing and vibration polishing, and then subjected to a pretreatment by ion milling.

Then, the rolled cross section (RD) and the rolling vertical cross section (TD) were analyzed in each sample by EBSD. Based on a profile of each cross section obtained by EBSD, grain sizes and the like of crystal grains were measured. At this point, when an angle difference between adjacent crystal grains was found to be 6° or more as a result of the EBSD, it was determined as a grain boundary, and all crystal grains within an observation region were discriminated. Then, the discriminated crystal grains were subjected to elliptical fit to measure a grain size and an aspect ratio of each crystal grain within the observation region. For this analysis, image processing software (HKL CHANNEL 5 manufactured by Oxford Instruments) was used.

For setting determination regions in the thickness-direction cross sections (rolled cross section (RD), and the rolling vertical cross section (TD)) of each sample, each cross section was equally divided into 10 sections, and 8 sections excluding both end sections were set as the determination region. Then, an average grain size in each section, and an average grain size in the entire determination region were measured. Further, a standard deviation of the average grain size of each section was calculated to calculate a coefficient of variation in the determination region.

It is noted that a grain size on the surface was also measured in each of the platinum targets of the Examples and the Comparative Examples. Further, hardness in the thickness-direction cross section of each platinum target was also measured. The hardness was measured with a Vickers hardness tester (load: 0.1 kgf), and was measured in a plurality of points to obtain an average.

Figure 3:
FIG. 3 is a diagram illustrating a material structure (EBSD) of a platinum sputtering target of Example 1.

Measurement results of the average grain size, the coefficient of variation, and proportions of crystal grains having an aspect ratio of 3 and 5 or more in the entire determination region in the thickness-direction cross section of each sample thus obtained are shown in Table 2. Further, as an example of the material structure in the thickness-direction cross section of the target analyzed by EBSD, the material structure of the rolled cross section of the sample No. 1 of Example 1 is shown in FIG. 3.

TABLE 2

| | Average Grain Size in Surface Direction (μm) | Thickness Direction (Determination Region) | | | | | | | |
|---|---|---|---|---|---|---|---|---|---|
| | | Average Grain Size (μm) of Entire Region | | Coefficient of Variation (%) | | Crystal Grains with Aspect Ratio of 3 or more (%) | | Crystal Grains with Aspect Ratio of 5 or more (%) | | Hardness |
| | | RD | TD | RD | TD | RD | TD | RD | TD | (HV) |

No. 1 (vicinity of length direction center)

| | | RD | TD | RD | TD | RD | TD | RD | TD | (HV) |
|---|---|---|---|---|---|---|---|---|---|---|
| Example 1 | 38.3 | 37.5 | 36.6 | 5.5 | 6.5 | 6.4 | 5.2 | 0.6 | 0.5 | 53 |
| Example 2 | 43.6 | 34.7 | 34.4 | 14.4 | 8.5 | 11.9 | 12.7 | 1.4 | 1.2 | 59 |
| Example 3 | 52.3 | 48.5 | 49.1 | 8.4 | 8.4 | 6.3 | 5.1 | 0.5 | 0.5 | 51 |
| Comparative Example 1 | 53.6 | 44.6 | 44.0 | 19.2 | 27.3 | 4.4 | 3.8 | 0.6 | 0.5 | 54 |
| Comparative Example 2 | 169.2 | 185.8 | 209.3 | 14.0 | 16.6 | 5.8 | 3.5 | 0.5 | 0.8 | 52 |
| Comparative Example 3*[1] | — | — | — | — | — | — | — | — | — | 127 |

No. 3 (vicinity of side surface)

| | | RD | TD | RD | TD | RD | TD | RD | TD | (HV) |
|---|---|---|---|---|---|---|---|---|---|---|
| Example 1 | 34.5 | 36.4 | 36.2 | 5.6 | 7.0 | 6.7 | 6.1 | 0.3 | 0.7 | 52 |
| Example 2 | 39.8 | 33.2 | 31.4 | 6.9 | 10.5 | 9.8 | 16.9 | 1.2 | 2.6 | 59 |
| Example 3 | 46.4 | 47.6 | 49.4 | 7.9 | 6.5 | 6.7 | 5.9 | 0.7 | 0.6 | 51 |
| Comparative Example 1 | 48.6 | 38.0 | 36.9 | 6.1 | 9.1 | 4.7 | 3.1 | 0.5 | 0.5 | 57 |
| Comparative Example 2 | 165.5 | 227.5 | 208.4 | 18.6 | 8.3 | 11.5 | 3.7 | 2.5 | 1.0 | 50 |
| Comparative Example 3*[1] | — | — | — | — | — | — | — | — | — | 130 |

*[1]Since no grain boundary was found as a result of analysis by EBSD, values could not be measured in Comparative Example 3.

Referring to Table 2, the average grain size in the entire determination region of the thickness-direction cross section was 150 μm or less in the targets of the Examples. The coefficient of variation of the average grain size in the determination region was 15% or less. Thus, the criteria were met in both of the rolled cross section (RD) and the rolling vertical cross section (TD). This also applied to both of the two samples (No. 1 and No. 3). It is confirmed that the results depend on neither the size of the cast platinum resulting from the melting and casting step nor the number of times of performing forging in the forging step.

On the other hand, in the target of Comparative Example 1 produced without performing the homogenization heat treatment, the coefficient of variation of the average grain size was over 15% in the sample No. 3. Since a difference in the production process between Comparative Example 1 and Example 1 was whether or not the homogenization heat treatment was performed, it was confirmed that the uniformity in the crystal grains in the thickness direction is improved by the homogenization heat treatment. However, when the temperature in the recrystallization heat treatment was high as in Comparative Example 2, the average grain size coarsened as a whole in the thickness direction. In addition, the coefficient of variation was also out of the prescription in either of the rolled cross section and the rolling vertical cross section. It is noted that no grain boundary was found in the analysis by EBSD in Comparative Example 3. It is probably because Comparative Example 3 was constituted by a rolled structure since the final recrystallization heat treatment was not performed.

In the measurement results of the aspect ratio of the crystal grain in the thickness-direction cross section of the respective platinum sputtering targets, good values were obtained also in Comparative Examples 1 and 2. On the contrary, the proportion of the crystal grains having an aspect ratio of 3 or more was higher in Examples 1 to 3. Based on this result, it is considered that crystal grains having a high aspect ratio are liable to be formed in a platinum sputtering target produced through the production process characterized by the homogenization heat treatment of the present invention. The reason is unclear. Therefore, when the prescription of the average grain size in the thickness-direction cross section of the present invention (the coefficient of variation in the determination region of 15% or less) is met, it is presumed that the aspect ratio may be preferably considered in some cases. In consideration of results of a deposition test described below, however, in-plane uniformity in the film thickness can be deemed to be assured when the proportion of crystal grains having an aspect ratio of 3 or more is 20% or less (more preferably 18% or less), and the proportion of crystal grains having an aspect ratio of 5 or more is 3% or less (more preferably 1% or less), as in the present Examples.

Next, deposition properties, particularly in-plane uniformity over time obtained using the platinum sputtering targets of Examples 1 to 3 and Comparative Examples 2 and 3 were evaluated. In this evaluation test, each target and a substrate (12-inch silicon wafer) were set in a magnetron sputtering apparatus, and an inert gas was charged thereinto after vacuum evacuation. Sputtering was performed under two conditions (condition 1 (small sputtering power) and condition 2 (large sputtering power)) in accordance with a sputtering rate.

A wear depth of the target due to deposition is estimated with monitoring the sputtering rate. The deposition was performed at each of an initial stage of use (wear depth of about 0.2 mm), an intermediate stage of use (wear depth of about 0.8 mm), and a late stage of use (wear depth of about 1.5 mm) of the target. A platinum thin film deposited on the wafer at each stage was sampled uniformly in about 30 to 50 points on the wafer, and a film thickness and a sheet resistance value were measured in each point. The film thickness was measured by fluorescent X-ray analysis. The sheet resistance was measured by four-terminal measurement. Based on the values thus obtained, an average and a standard deviation were calculated, and a value obtained by dividing the standard deviation by the average was used as an index of variation. Evaluation results thus obtained are shown in Table 3. In the evaluation of the present embodiment, when the variation of both the film thickness and the sheet resistance was 3.0% or less, the target was determined to be acceptable, and if the variation was not clearly improved in accordance with this criterion, the deposition test was stopped.

TABLE 3

|  |  | Conditions 1 | | Conditions 2 | |
| --- | --- | --- | --- | --- | --- |
|  | Wear Depth of Target | Variation (%) in Film Thickness | Variation (%) in Sheet Resistance | Variation (%) in Film Thickness | Variation (%) in Sheet Resistance |
| Example 1 | Initial Stage of Use | 0.3 | 0.6 | 0.7 | 0.9 |
|  | Intermediate Stage of Use | 0.2 | 0.5 | 0.5 | 0.9 |
|  | Late Stage of Use | 0.8 | 1.0 | 1.1 | 1.4 |
| Example 2 | Initial Stage of Use | 0.4 | 0.8 | 0.7 | 1.2 |
|  | Intermediate Stage of Use | 0.2 | 0.4 | 0.4 | 0.6 |
|  | Late Stage of Use | 0.7 | 0.9 | 1.0 | 1.4 |
| Example 3 | Initial Stage of Use | 0.3 | 0.5 | 0.2 | 0.4 |
|  | Intermediate Stage of Use | 0.3 | 0.7 | 0.1 | 1.1 |
|  | Late Stage of Use | 1.7 | 2.0 | 2.0 | 2.1 |
| Comparative Example 1 | Initial Stage of Use | 1.3 | 1.5 | 1.7 | 1.5 |
|  | Intermediate Stage of Use | 1.4 | 2.2 | 1.9 | 2.2 |
|  | Late Stage of Use | 4.0 | 4.5 | 4.3 | 5.3 |
| Comparative Example 2 | Initial Stage of Use | 2.5 | 3.2 | 2.8 | 3.2 |
|  | Intermediate Stage of Use | 2.5 | 2.4 | 2.8 | 3.8 |
|  | Late Stage of Use[*1] | — | — | — | — |

TABLE 3-continued

| | | Conditions 1 | | Conditions 2 | |
|---|---|---|---|---|---|
| | Wear Depth of Target | Variation (%) in Film Thickness | Variation (%) in Sheet Resistance | Variation (%) in Film Thickness | Variation (%) in Sheet Resistance |
| Comparative Example 3 | Initial Stage of Use | 3.2 | 3.2 | 3.5 | 4.8 |
| | Intermediate Stage of Use | 3.7 | 4.2 | 3.8 | 4.8 |
| | Late Stage of Use*[1] | — | — | — | — |

*[1]The film formation was stopped because in-plane uniformity would not be improved.

Referring to Table 3, it is understood that the platinum sputtering targets of Examples 1 to 3 can achieve deposition stably providing good in-plane uniformity from the initial stage of use to the late stage of use.

On the contrary, in using each of the Comparative Examples having the coefficient of variation of the average grain size in the thickness-direction cross section out of the prescription, in-plane uniformity of the film thickness was inferior from the initial stage of use, which was the same even at the intermediate stage of use. Specifically, in the target of Comparative Example 3 produced without performing the recrystallization heat treatment step after the rolling step, the grain boundary was not found, and in-plane uniformity was the most inferior. In the target of Comparative Example 2 obtained by employing a high heating temperature in the recrystallization heat treatment step, the average grain size of the crystal grains was so large that the requirements of in-plane uniformity could not be met. In addition, in the target of Comparative Example 1 produced without performing the homogenization heat treatment, in-plane uniformity was better than those of Comparative Examples 2 and 3, but was largely degraded at the late stage of use, and thus change over time of in-plane uniformity could not be suppressed.

It was confirmed, based on these evaluations of deposition, that it is important to control the material structure in the thickness cross section of a target for obtaining good in-plane uniformity in the deposition step. It was also confirmed that it is necessary, for this purpose, to apply the homogenization heat treatment and set an appropriate temperature in the recrystallization heat treatment step in the production process of a platinum-based sputtering target.

In addition to the platinum sputtering target described above, a sputtering target containing a platinum alloy obtained by adding, as an additional element, any one element of palladium, rhodium, iridium, ruthenium, cobalt, manganese, nickel, and tungsten, to platinum in a composition range of 1 at % or more and 30 at % or less is also useful. The concentrations of the additional elements of these platinum alloys are within a composition range of a solid solubility limit, and therefore, these alloys can be comparatively easily obtained. In addition, even when any one of these additional elements is added in the composition range of 1 at % or more and at % or less, the resultant platinum alloy is similar to a platinum target in processability, and hence the production method of the present invention can be applied. As described above, in the production method of the present invention, a sputtering target is provided with good in-plane uniformity and effectiveness in suppressing change over time of in-plane uniformity. A platinum-alloy sputtering target obtained by this production method also has in-plane uniformity, and effectiveness in suppressing change over time thereof.

INDUSTRIAL APPLICABILITY

The platinum-based sputtering target of the present invention can stably produce a platinum thin film or a platinum alloy thin film having good in-plane uniformity in the deposition step. This is because an average grain size of crystal grains in a thickness-direction cross section is strictly prescribed. The present invention is useful for a thin film electrode of a semiconductor device, a recording film of a magnetic recording medium and the like requiring a high quality platinum thin film or platinum alloy thin film.

What is claimed is:

1. A platinum-based sputtering target comprising platinum or a platinum alloy,
   wherein when a thickness-direction cross section is equally divided into n sections (n=5 to 20) along a thickness direction, a region including (n−2) sections excluding both end sections is set as a determination region, and an average grain size in each of the sections is measured in the determination region, as well as an average grain size in the entire determination region is measured,
   the average grain size in the entire determination region is 150 μm or less, and
   a coefficient of variation calculated based on the average grain size in each of the sections of the determination region is 15% or less, and,
   in the determination region, a number-based proportion of crystal grains having an aspect ratio of 3 or more is 20% or less, and a number-based proportion of crystal grains having an aspect ratio of 5 or more is 9% or less.

2. The platinum-based sputtering target according to claim 1, wherein the average grain size in the entire determination region is 40 μm or less.

3. The platinum-based sputtering target according to claim 1, wherein the platinum-based sputtering target comprises platinum with a purity of 99.99% by mass or more.

4. The platinum-based sputtering target according to claim 1, wherein the platinum-based sputtering target comprises an alloy containing, as an additional element, any one of palladium, rhodium, iridium, ruthenium, cobalt, manganese, nickel, and tungsten in an amount of 1 at % or more and 30 at % or less, and
   wherein the alloy has a total purity of platinum and the additional element of 99.9% by mass or more.

5. A method for producing the platinum-based sputtering target according to claim 1, comprising:
   a forging step of forging at least once a casting comprising platinum or platinum alloy resulting from melting and casting to produce an ingot; a rolling step of rolling at least once the ingot to produce a rolled material to; and
   a recrystallization heat treatment step of heat treating the rolled material, wherein a homogenization heat treatment for heating the ingot at a temperature of 850° C. or more and 950° C. or less is performed after the forging step and before the rolling step, and wherein a heating temperature for the rolled material in the recrystallization heat treatment step is 600° C. or more and 700° C. or less.

6. The method for producing the platinum-based sputtering target according to claim 5, wherein a heating time for the ingot in the homogenization heat treatment step is 60 minutes or more and 120 minutes or less.

7. The platinum-based sputtering target according to claim 2, wherein in the determination region, a number-based proportion of crystal grains having an aspect ratio of 3 or more is 20% or less, and a number-based proportion of crystal grains having an aspect ratio of 5 or more is 9% or less.

8. The platinum-based sputtering target according to claim 2, wherein the platinum-based sputtering target comprises platinum with a purity of 99.99% by mass or more.

9. The platinum-based sputtering target according to claim 2, wherein the platinum-based sputtering target comprises an alloy containing, as an additional element, any one of palladium, rhodium, iridium, ruthenium, cobalt, manganese, nickel, and tungsten in an amount of 1 at % or more and 30 at % or less, and wherein the alloy has a total purity of platinum and the additional element of 99.9% by mass or more.

* * * * *